United States Patent
Whitehair et al.

(10) Patent No.: US 6,943,451 B2
(45) Date of Patent: Sep. 13, 2005

(54) SEMICONDUCTOR DEVICES CONTAINING A DISCONTINUOUS CAP LAYER AND METHODS FOR FORMING SAME

(75) Inventors: Stanley Joseph Whitehair, Peekskill, NY (US); Stephen McConnell Gates, Ossining, NY (US); Sampath Purushothaman, Yorktown Heights, NY (US); Satyanarayana V. Nitta, Poughquag, NY (US); Maurice McGlashan-Powell, Yonkers, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/897,200

(22) Filed: Jul. 2, 2001

(65) Prior Publication Data

US 2003/0001240 A1 Jan. 2, 2003

(51) Int. Cl.⁷ .......................... H01L 23/48; H01L 23/52; H01L 23/58; H01L 29/40; H01L 21/4763
(52) U.S. Cl. ....................... 257/774; 257/638; 257/642; 438/629; 438/725
(58) Field of Search ................................. 257/638, 639, 257/640, 642, 751, 774, 758, 752, 760, 762, 763, 764, 765, 766, 773, 700, 701, 702, 741, 506, 508, 621, 622, 637; 438/769, 724, 725, 627, 629

(56) References Cited

U.S. PATENT DOCUMENTS

| | | | | |
|---|---|---|---|---|
| 5,968,333 A | * | 10/1999 | Nogami et al. | 205/123 |
| 5,981,000 A | * | 11/1999 | Grill et al. | 427/577 |
| 6,051,869 A | * | 4/2000 | Pan et al. | 257/506 |
| 6,274,499 B1 | * | 8/2001 | Gupta et al. | 438/692 |
| 6,281,127 B1 | * | 8/2001 | Shue | 438/691 |
| 6,346,747 B1 | * | 2/2002 | Grill et al. | 257/752 |
| 6,417,537 B1 | * | 7/2002 | Yang et al. | 257/310 |
| 6,448,655 B1 | * | 9/2002 | Babich et al. | 257/759 |
| 6,475,810 B1 | * | 11/2002 | Zhou et al. | 438/633 |
| 6,524,962 B2 | * | 2/2003 | Chen et al. | 438/694 |

OTHER PUBLICATIONS

Merriam-Webster's Collegiate Dictionary 10$^{th}$ Edition, 2001, pp. 250 and 330.*

* cited by examiner

Primary Examiner—Nathan J. Flynn
Assistant Examiner—Victor A. Mandala, Jr.
(74) Attorney, Agent, or Firm—Daniel P. Morris

(57) ABSTRACT

Novel semiconductor devices containing a discontinuous cap layer and possessing a relatively low dielectric constant are provide herein. The novel semiconductor devices includes at least a substrate, a first dielectric layer applied on at least a portion of the substrate, a first set of openings formed through the dielectric layer to expose the surface of the substrate so that a conductive material deposited within and filling the openings provides a first set of electrical contact conductive elements and a discontinuous layer of cap material covering at least the top of the conductive elements to provide a first set of discontinuous cap elements. Methods for forming the semiconductor devices are also provided.

28 Claims, 6 Drawing Sheets

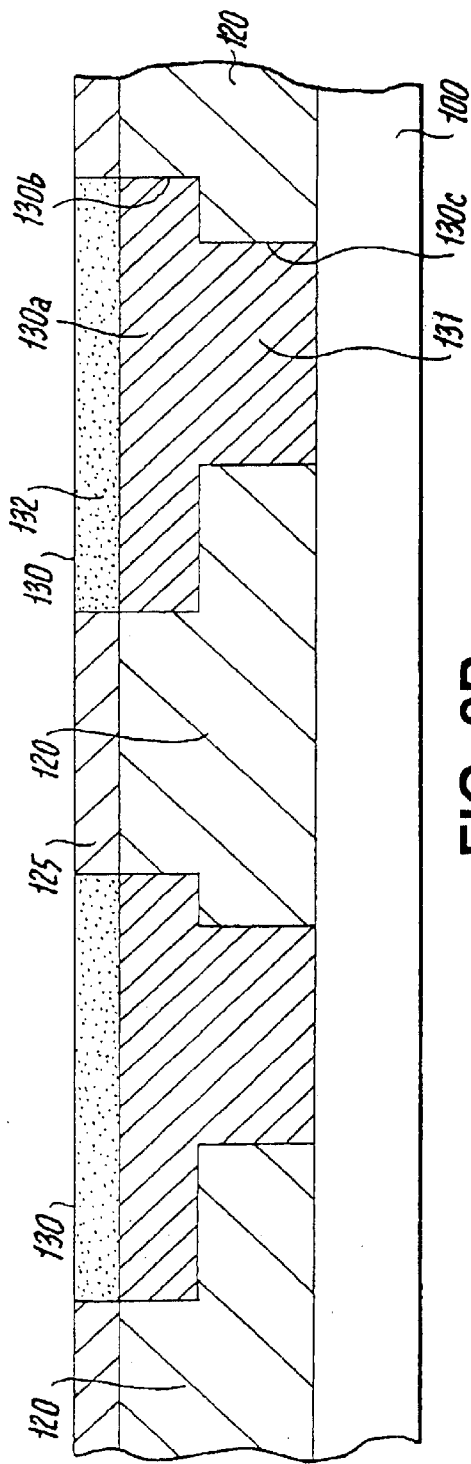
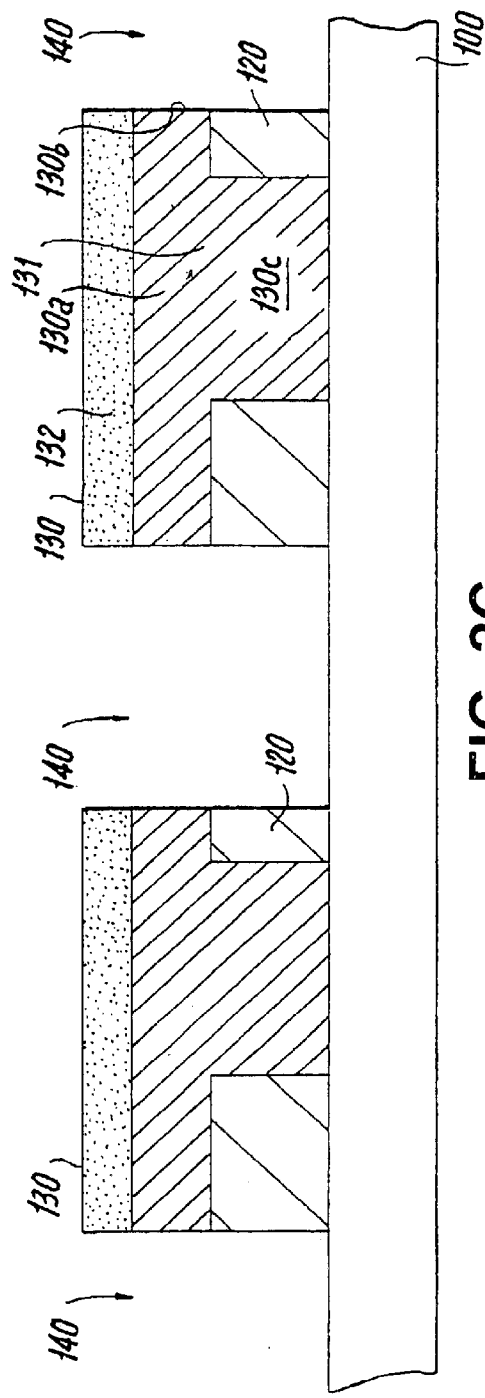
FIG. 2B
FIG. 2C

SEMICONDUCTOR DEVICES CONTAINING A DISCONTINUOUS CAP LAYER AND METHODS FOR FORMING SAME

BACKGROUND

1. Technical Field

Semiconductor devices containing a discontinuous cap layer are described herein. More particularly, semiconductor devices formed from substrates containing one or more conductive metal elements each having a cap material applied thereon as a discontinuous cap layer are described herein. Also described are methods for manufacturing such semiconductor devices.

2. Description of Related Art

Generally, semiconductor devices include a plurality of circuits which form an integrated circuit. Integrated circuits can be useful for computers and electronic equipment and can contain millions of transistors and other circuit elements that can be fabricated on a single silicon crystal semiconductor device, i.e., chip. For the device to be functional, a complex network of signal paths will normally be routed to connect the circuit elements distributed on the surface of the device. Efficient routing of these signals across the device can become more difficult as the complexity and number of the integrated circuits are increased. Thus, the formation of multi-level or multi-layered interconnection schemes such as, for example, dual damascene wiring structures, have become more desirable due to their efficacy in providing high speed signal routing patterns between large numbers of transistors on a complex semiconductor chip.

When fabricating integrated circuit wiring with a multi-layered scheme, an insulating or dielectric material, e.g., silicon oxide or the low dielectric constant insulators described herein, will normally be patterned with several thousand openings to create conductive line openings and/or via openings using photoprocessing techniques, e.g., photolithography with subsequent etching by a plasma process. These via openings are typically filled with a conductive metal material, e.g., aluminum, copper, etc., to interconnect the active and/or passive elements of the integrated circuits. The semiconductor device is then polished to level its surface.

A continuous cap layer is then normally deposited over the planarized surface featuring the dielectric material and conductive metal material. Next, a dielectric material is deposited over the continuous cap layer, via and conductive line openings are created within the dielectric layer as before, another conductive metal material is deposited within the openings and another continuous cap layer is deposited thereon. The process is then repeated to fabricate a multi-layer interconnect wiring system.

However, several problems exist when employing a continuous cap layer. First, the continuous cap layer possesses a relatively high dielectric constant, typically between 4 and 7, causing the resulting semiconductor device to also possess a relatively high effective dielectric constant, typically between 3 and 5. This, in turn, results in a higher capacitance between the conductive metal material causing the electric signals to travel at a slower speed with increased cross-talk through the interconnection wiring patterns. Second, the reliability of the semiconductor device is limited because the electromigration lifetime of the wiring structures is relatively short.

It would be desirable to provide a semiconductor device containing a discontinuous cap layer that can provide a relatively low effective dielectric constant for the device thereby allowing the electric signals to travel faster therethrough. This, in turn, will allow for the device to have a reduced effective capacitance. An increased electromigration lifetime of the device is also desirable.

SUMMARY

Novel semiconductor devices containing a discontinuous cap layer, i.e., discontinuous cap elements, and possessing a relatively low dielectric constant have been discovered. The novel semiconductor device containing the discontinuous cap layer includes at least a substrate, a first dielectric layer applied on at least a portion of the substrate, a first set of openings formed through the dielectric layer to expose the surface of the substrate so that a conductive material deposited within and filling the openings provides a first set of electrical contact conductive elements and a discontinuous layer of cap material covering at least the top of the elements to provide a first set of discontinuous cap elements. Optionally, an opening is formed between the first set of conductive metal elements and through the dielectric layer to expose the surface of at least a portion of the substrate so that a second dielectric material is deposited in and fills the opening. This is known as a gap fill structure. The semiconductor device may also include a third dielectric layer applied on the top surfaces of the cap elements and first or second dielectric layer between the first set of conductive metal elements, a second set of openings formed through the third dielectric layer to expose the surface of at least a portion of the discontinuous cap elements so that a conductive metal material deposited within and filling the second set of openings provides a second set of electrical contact conductive metal elements, and a second cap material applied to and in contact with at least a portion of the top surface of the second set of conductive metal elements as a discontinuous layer to provide a second set of discontinuous cap elements.

An alternative semiconductor device containing a discontinuous cap layer and possessing a relatively low effective dielectric constant in accordance with the present disclosure is also provided. The novel semiconductor device containing the discontinuous cap layer includes at least a substrate, a first dielectric layer applied on at least a portion of the substrate, a first set of openings formed through the dielectric layer to expose the surface of the substrate so that a conductive material deposited within at least a portion of the opening and a cap material applied to and in contact with the top surface of the conductive material and filling the remaining portion of the opening. Optionally, a gapfill opening formed between the first set of conductive metal elements and through the dielectric layer to expose the surface of at least a portion of the substrate so that a second dielectric material is deposited in and fills the opening.

A method for making the semiconductor device has also been discovered which comprises the steps of:

a) providing a substrate having a dielectric layer formed thereon;

b) forming at least a first and second opening in the dielectric layer and exposing the top surface of the substrate;

c) depositing a conductive metal material within and filling the openings;

d) depositing a cap material over the top surfaces of the first set of conductive elements and dielectric layer; and e) etching the cap material over the dielectric layer and between the conductive metal elements to substantially remove the cap layer and expose the dielectric layer to provide a set of discontinuous cap elements.

An alternative method for forming the semiconductor device comprises the steps of:

a) providing a substrate having a first dielectric layer formed thereon;

b) forming at least a first and second opening in the dielectric layer and exposing the surface of the substrate;

c) depositing a mixture comprising a major amount of a conductive metal material and minor amount of a segregating metal material within and filling the first and second opening; and d) heating the device in a selected gas mixture to a temperature and for a time period sufficient for the segregating metal material to segregate to the top of each opening and form on the surface of the conductive metal.

By forming discontinuous cap elements on the top surfaces of the conductive metal elements, the semiconductor devices containing the discontinuous cap elements described herein advantageously possess a low effective dielectric constant thereby causing the electric signals generated by the device to travel at a faster rate with reduced cross-talk. Thus, even if the cap material may have a high dielectric constant (e.g., SiNitride), the formation of the discontinuous cap elements results in a low effective dielectric constant for the overall device, e.g., an effective dielectric constant ranging from about 1.5 to about 3.5 in the case of no gapfill structure present in the device and an effective dielectric constant ranging from about 1.0 to about 3.0 and preferably about 1.5 and about 2.3 in the case of a gapfill structure present in the device.

BRIEF DESCRIPTION OF THE DRAWINGS

Preferred embodiments of the present disclosure are described below with reference to the drawings, which are described as follows:

FIG. 2B is a schematic cross-sectional view of the semiconductor substrate of FIG. 2A with a conductive metal material and a metal oxide cap material deposited in the etched openings to form a set of conductive metal and metal oxide cap elements;

FIG. 2C is a schematic cross-sectional view of the semiconductor substrate of FIG. 2B with a gapfill opening.

DESCRIPTION OF THE PREFERRED EMBODIMENTS

Figure 1A:
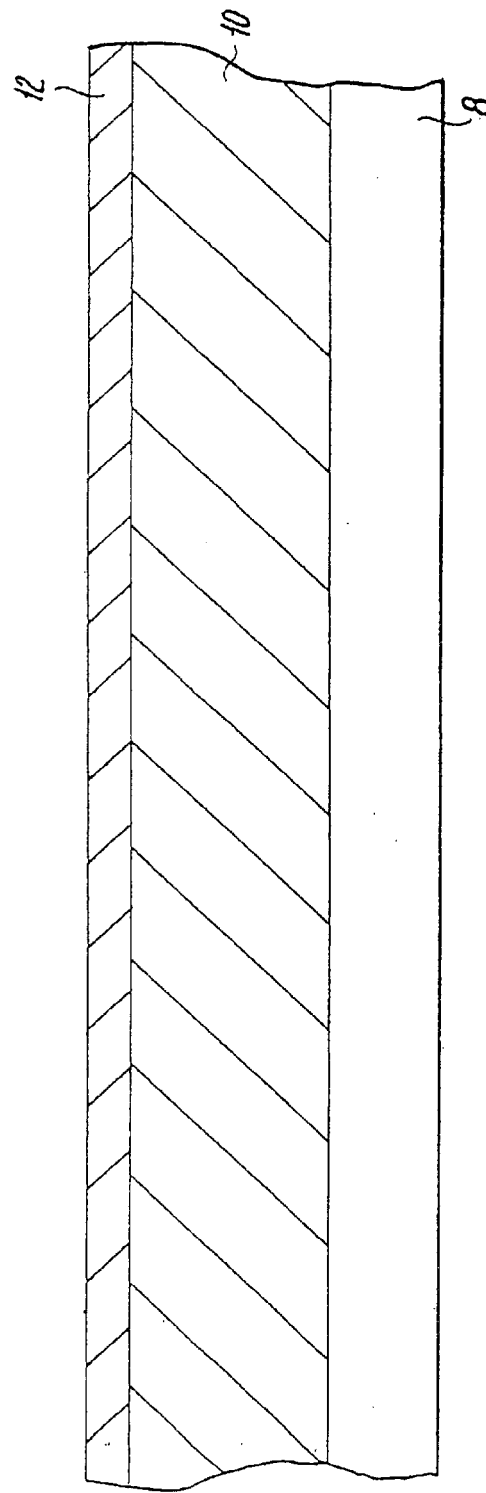
FIG. 1A is a schematic cross-sectional view of a semiconductor substrate containing a dielectric layer and an etchstop layer.

One embodiment in accordance with the present disclosure provides semiconductor devices including at least a semiconductor substrate containing, for example, a first dielectric layer and a first set of openings formed therein and filled with a conductive metal material to provide a first set of conductive metal elements and a first cap material applied on the top surface and in contact with at least a portion of the set of conductive metal elements to form a first set of discontinuous cap elements, i.e., discontinuous cap layers. The semiconductor device may also include a second dielectric layer applied on the surfaces of the discontinuous cap elements and first dielectric layer, a second set of openings formed within the second dielectric layer and exposing the surface of the cap elements therein, a conductive metal material deposited within and filling the openings to form a second set of conductive metal elements, and, a second cap material applied on the top surfaces and in contact with at least a portion of the second conductive metal elements to provide a second set of discontinuous cap elements. The semiconductor device may also include a plurality of layers of dielectric and metal elements formed according to the above description such as, for example, about 5 to about 10 layers.

Referring now to FIGS. 1A–1F, one such semiconductor device in accordance with the present disclosure can be formed by first providing a semiconductor substrate 8 that is of the conventional type and may contain, for example, circuitry and other interconnection levels. Generally, the semiconductor substrate 8 will first have dielectric layer 10 formed on at least a portion thereon. Suitable materials for dielectric layer 10 can include any conventional organic or inorganic porous and non-porous material known to one skilled in the art, particularly those materials with a low dielectric constant. It is particularly advantageous to employ porous dielectric materials herein since, as one skilled in the art would appreciate, these materials will decrease the effective dielectric constant of the semiconductor device.

Preferred organic materials include, but are not limited to, organic thermosets such as, for example, SiLK, Flare, polyimides, polyarylene ethers, benzocyclobutenes and the like with SiLK being most preferred for use herein. The organic dielectric materials useful in forming organic dielectric layer 10 will ordinarily possess a dielectric constant less than about 3 and preferably from about 2 to about 2.7. The average pore size and size distribution of these materials will ordinarily range from about 1 to about 50 nm, with less than about 10 nm being preferred.

Preferred inorganic materials for use herein include, but are not limited to, materials composed of silicon oxide optionally containing one or more elements selected from C, H and F, e.g., FSG, C doped oxide, F doped oxide, alloys of Si, C, O and H, $SiO_2$, and the like. Specific examples include, but are not limited to, Black Diamond from Applied Materials, Coral from Novellus Systems, and a variety of spin applied films based on hydrogen silsesquioxane (HSQ), methyl silsesquioxane (MSQ), phenyl silsesquioxane and the like. Also, porous forms of these materials may be used, with the average pore size being from about 1 to about 50 nm and preferably less than about 10 nm. The inorganic dielectric materials useful in forming inorganic dielectric layer 10 will ordinarily possess a dielectric constant less than about 3.5 and preferably from about 2 to about 3.

Techniques and parameters for forming dielectric layer 10 on substrate 8 (e.g., spin coating) are within the purview of one skilled in the art. The dielectric layer 10 can ordinarily be applied on the surface of substrate 8 as a substantially planarized layer. A substantially planarized layer can be achieved either directly through the formation process, e.g., in the case of a chemical vapor deposition or spin on technique, or by applying known and conventional procedures, e.g., chemical-mechanical polishing (CMP), once the dielectric layer 10 has been formed to advantageously provide a substantially planarized surface as generally depicted in FIG. 1A. Typically, the thickness of dielectric layer 10 will range from about 100 to about 600 nm and preferably from about 100 to about 300 nm.

When employing an organic dielectric material as layer 10, it is particularly advantageous to form a mask/polish stop layer 12 on organic dielectric layer 10. Suitable materials for mask/polish layer 12 can include any conventional material known to one skilled in the art. Preferred materials for use herein include, but are not limited to, amorphous films of SiN, SiCH, SiCOH, silicon oxide and the like. Techniques and parameters for forming mask/polish stop layer 12 are within the purview of one skilled in the art. This layer is advantageously employed as a hardmask and/or a chemical-mechanical polishing (CMP) stop layer when, as described below, for subsequent processing steps of the device, e.g., when forming openings 14 and/or cap elements 20 discussed hereinbelow. Mask/polish stop layer 12 can then be subjected to a planarization process such as, for example, a standard CMP polishing process known to one skilled in the art to remove any metal thereon and provide a substantially planarized surface. Optionally, layer 12 may have about 2 or about 3 sub-layers.

Figure 1B:
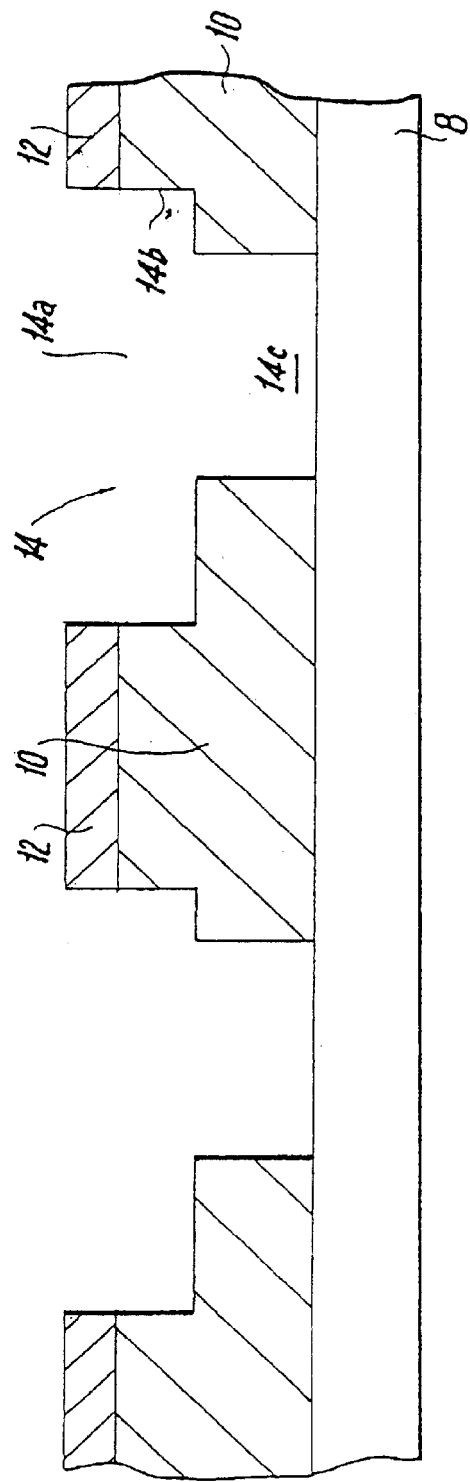
FIG. 1B is a schematic cross-sectional view of the semiconductor substrate of FIG. 1A with etched openings.

Once inorganic dielectric layer 10 or mask/polish stop layer 12 has been formed on the surface of organic dielectric layer 10, openings 14 having a top portion 14a with defining sidewalls 14b and lower portion 14c are formed therein to expose the top surface of substrate 8 as shown in FIG. 1B. It is particularly advantageous to create openings that are of a dual damascene (via plus next level conductor) wiring interconnect structure for use herein. Openings such as the dual damascene structure can be formed in layer 12 and organic dielectric layer 10 or inorganic dielectric layer 10 by techniques known to those skilled in the art.

For example, at least one top portion 14a of opening 14 will be formed in mask/polish stop layer 12 and/or dielectric layer 10, the top portion 14a of opening 14 having a first width and defining sidewalls 14b and bottom surface 14 (not shown) by techniques known to those skilled in the art, e.g., a resist layer (not shown) can be applied to the top surface of dielectric layer 10 or layer 12 and patterned and developed using known photolithographic techniques. Then an etching process is conducted to form top portion 14a of opening 14. The etch process can be, for example, a selective etch process or a suitable anisotropic etching technique such as reactive ion etching that etches the mask/polish stop layer 12, when employed, to form the top portion 14a. In other words, by using this process, the depth of top portion 14a of opening 14 formed during the etch process may be precisely controlled. Where layer 12 is not employed, then the etch process can be a timed etch through a portion of inorganic layer 10 to form top portion 14a of opening 14 which is within the purview of one skilled in the art. A desired width and depth of each top portion 14a of opening 14 will normally vary according to the design requirements for a given conductor, i.e., the conductive material that will eventually be used in the conductive line and via openings as discussed hereinbelow. A preferred width of each top portion 14a of opening 14 will ordinarily range from about 0.05 to about 10 $\mu$m and preferably from about 0.1 to about 1.2 $\mu$m while the depth will range from about 0.05 to about 1 $\mu$m and preferably from about 0.1 to about 0.4 $\mu$m.

Following the formation of top portion 14a of opening 14, another masking step is performed, e.g., a second resist layer (not shown) can be applied to the top surface of the opening and patterned and developed using known photolithographic techniques. Then etching(s) is conducted to form lower portion 14c of opening 14 by employing a suitable anisotropic etching technique, e.g., reactive ion etching (RIE). As one skilled in the art will readily appreciate, the width of top portion 14a will ordinarily be greater than the width of lower portion 14c of opening 14 to advantageously provide line and via openings. A preferred width of each lower portion 14c of opening 14 will ordinarily range from about 0.05 to about 5 $\mu$m and preferably from about 0.1 to about 0.6 $\mu$m. Parameters for creating openings 14 (e.g., type of etchant(s), concentration of etchant(s), time, temperature, etc.) are within the purview of one skilled in the art.

Figure 1C:
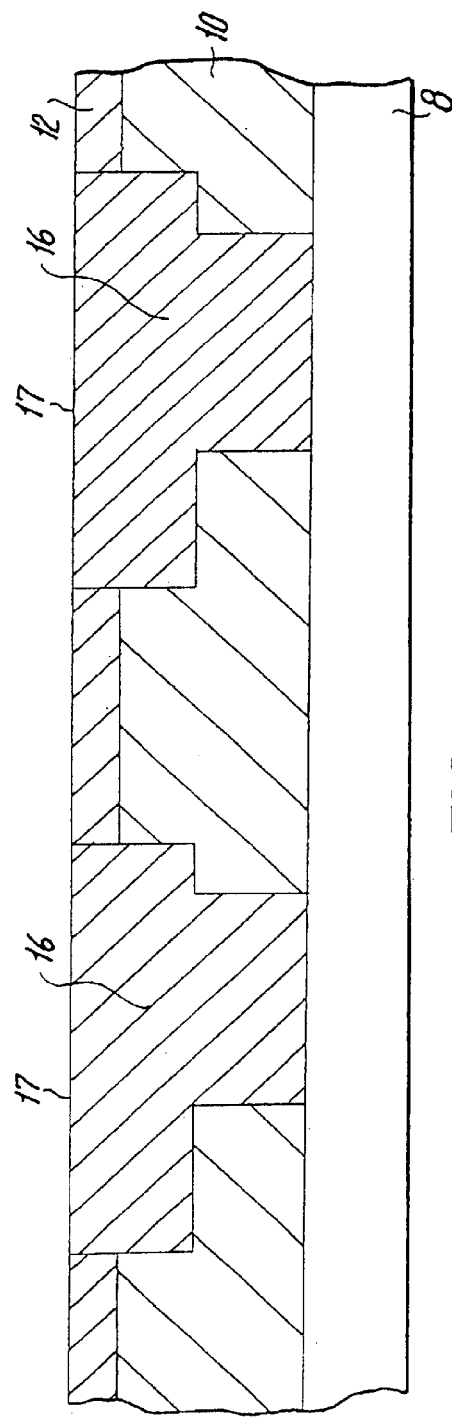
FIG. 1C is a schematic cross-sectional view of the semiconductor substrate of FIG. 1B with a conductive metal material deposited in the etched openings to form a set of conductive metal elements.

Following the formation of openings 14, a conductive material is deposited within and fills the top and lower portion of opening 14 to form a set of conductive metal elements 16 having a top surface 17 as shown in FIG. 1C. The set of conductive elements 16 can be formed by any known or conventional procedure, for example, by electroplating or selective or non-selective chemical vapor depositions (CVD's), sputtering or other physical vapor deposition. Any conventional conductive metal material can be used herein as the conductive material. Suitable metal materials for forming conductive elements 18 include, but are not limited to, Ti, TiN, TiW, Ta, TaN, W, Al, Cu, Pd and the like and combinations thereof with Cu being preferred for use herein. Excess metal commonly covers top surface 17, and is removed by, for example, CMP, leaving an essentially planar surface.

Figure 1D:
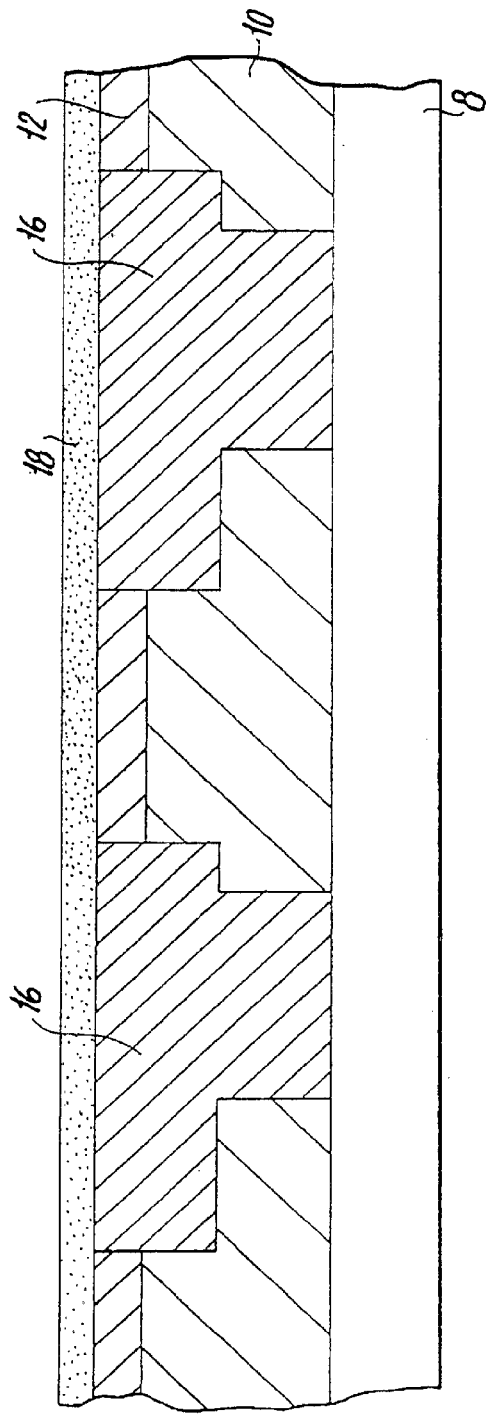
FIG. 1D is a schematic cross-sectional view of the semiconductor substrate of FIG. 1C with a continuous cap layer deposited on the top surfaces of the conductive metal elements and etchstop layer.

Next, a cap material is deposited on the top surfaces of inorganic dielectric layer 10 or mask/polish stop layer 12 and conductive metal elements 16 as continuous layer 18 as shown in FIG. 1D. Suitable materials for forming cap layer include conventional dielectric diffusion barrier materials known to one skilled in the art. Preferred dielectric materials include silicon based dielectric materials such as, for example, silicon nitride, amorphous silicon carbide, amorphous alloys of Si, N, C and H, SiNOH, SiCOH and the like. Techniques for depositing cap layer 18 are within the purview of one skilled in the art, e.g., PE CVD. The thickness of cap layer 18 will ordinarily range from about 10 to about 100 nm and preferably from about 20 to about 60 nm.

Figure 1E:
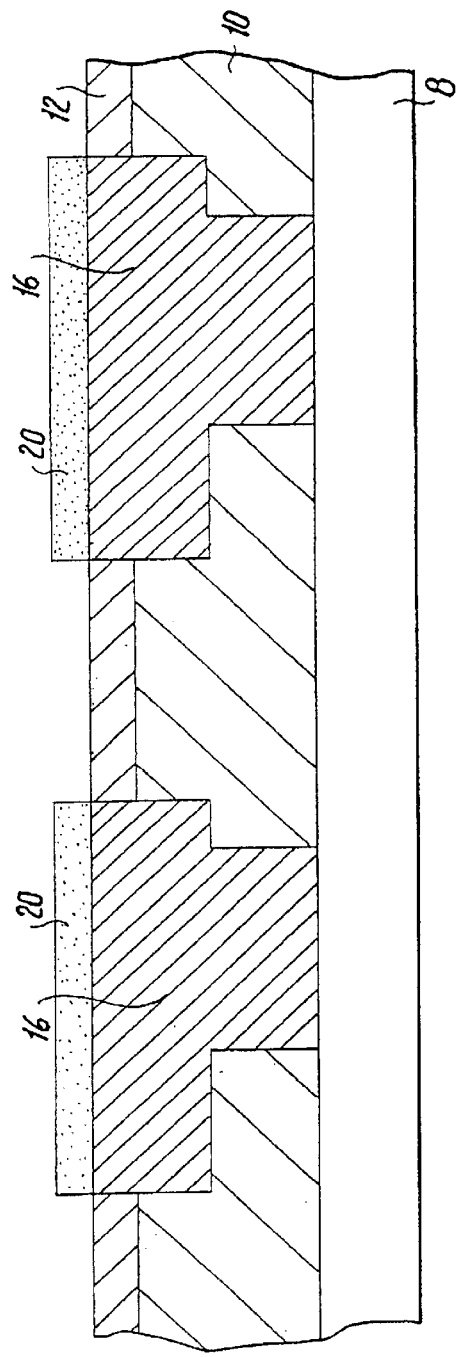
FIG. 1E is a schematic cross-sectional view of the semiconductor substrate of FIG. 1C with cap elements on the conductive metal elements.

Once cap layer 18 has been deposited as a continuous layer on the top surfaces of inorganic dielectric layer 10 or mask/polish stop layer 12 and conductive layer metal elements 16, cap layer 18 will be patterned in accordance with known and conventional procedures, e.g., applying a photoresist mask over inorganic dielectric layer 10 or mask/polish stop layer 12 and conductive metal elements 18, utilizing photolithography, employing a suitable selective etching technique to substantially remove the portion of the cap layer between the conductive metal elements 16 and exposing the top surface of inorganic dielectric layer 10 or mask/polish stop layer 12 to provide discontinuous cap elements 20 on the top surface of conductive metal elements 16 and then stripping the photoresist mask as shown in FIG. 1E. As one skilled in the art will readily appreciate, some portion of the cap material may remain on the top surface of inorganic dielectric layer 10 or mask/polish stop layer 12 following the removal process. However, it is desired that all of the cap material be removed from the top surface top surface of inorganic dielectric layer 10 or mask/polish stop layer 12 to form the discontinuous cap elements 20 on the top surface of conductive metal elements 16.

Accordingly, in the case where cap layer 18 is deposited over inorganic dielectric layer 10, then the portion of the cap layer between the conductive metal elements 16 and on the top surface of inorganic layer 10 can be selectively removed employing a suitable anisotropic etching technique such as, for example, reactive ion etching, to expose the top surface of inorganic dielectric layer 10 and provide discontinuous cap elements 20 on the top surface of conductive elements 16. In the case where cap layer 18 is deposited over layer 12, then the portion of the cap material of cap layer 18 between the conductive metal elements 16 and on the top surface of mask/polish stop layer 12 can be selectively removed employing (1) a suitable timed etch technique based on F etch chemistry when the cap material and mask/polish stop material possess the same etch rate or (2) a suitable selective etch technique when the cap material and mask/polish stop material possess different etch rates to expose the top surface of mask/polish stop layer 12 and provide discontinuous cap elements 20.

Figure 1F:
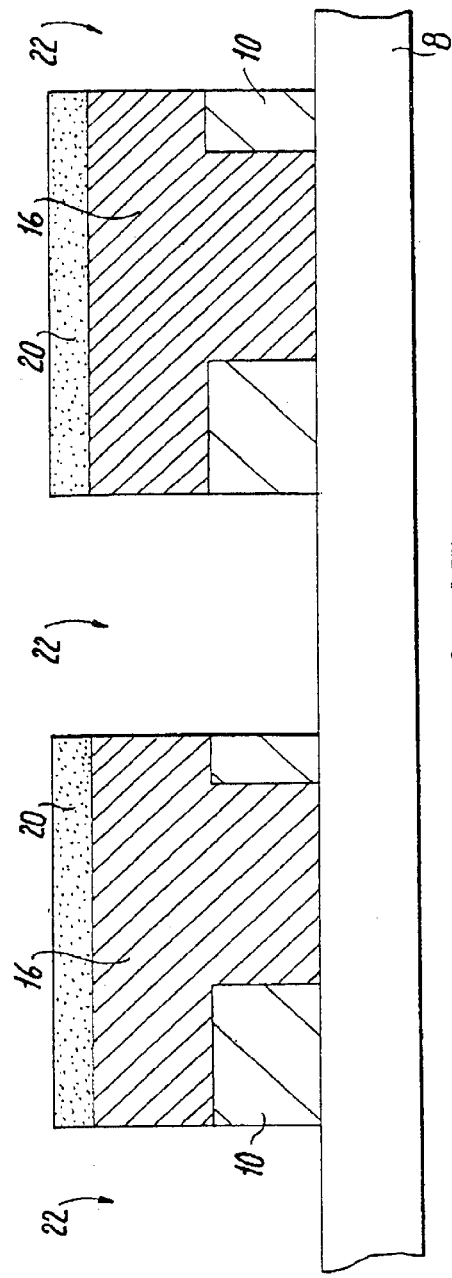
FIG. 1F is a schematic cross-sectional view of the semiconductor substrate of FIG. 1E with a gapfill opening.

If desired, inorganic dielectric layer 10 or layer 12 and organic dielectric layer 10 can be removed between conductive metal elements 16 to provide a gapfill opening 22 as shown in FIG. 1F. Generally, gapfill opening 22 can be formed by techniques known to in the art to substantially remove inorganic dielectric layer 10 or layers 10 and 12. For example, a resist layer (not shown) can be applied to the top of the device. The resist layer is patterned and developed using known photolithographic techniques. Then etching(s) is conducted to form opening 22 such as, for example, by employing a suitable anisotropic etching technique, e.g., reactive ion etching (RIE). Parameters for creating opening 22 (e.g., type of etchant(s), concentration of etchant(s), time, temperature, etc.) are within the purview of one skilled in the art. As one skilled in the art will readily appreciate, the sidewalls of top portion 14a of the conductive metal elements 16 will advantageously act as a hardmask during the etching procedure such that the width of opening 22 will be defined by the distance between the top portions of adjacent conductive elements 16 down to and exposing the surface of substrate 8. Additionally, since the sidewalls of the top portion 14a between conductive metal elements 16 act as a hardmask during the etching process, some portion of the organic or inorganic dielectric material of layer 10 will remain in the area underneath the top portion of conductive metal elements 18 and along the sidewalls of lower portion 14c and further in contact with the surface of the substrate.

Figure 1G:
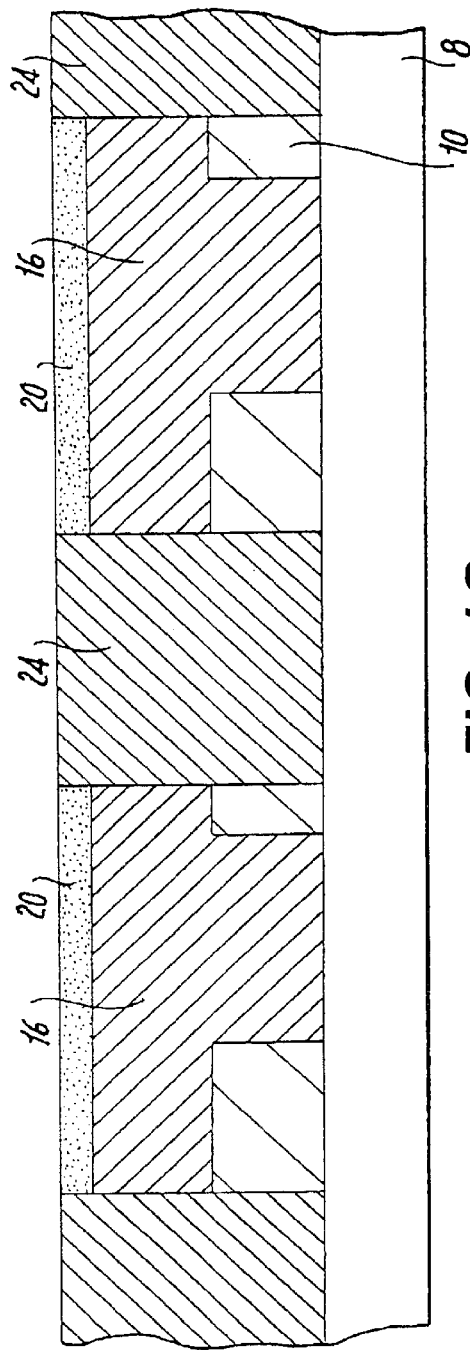
FIG. 1G is a schematic cross-sectional view of the semiconductor substrate of FIG. 1F with a dielectric material deposited in the gapfill opening after planarization.

Following the formation of opening 22, a relatively low dielectric constant material, e.g., one possessing a dielectric constant less than about 2.5 and preferably from about 1.5 to about 2.2, is deposited in and fills opening 22 to form low dielectric constant filled element 24 as depicted in FIG. 1G. Suitable materials for use herein include, but are not limited to, porous spin-on materials containing pores within a dielectric matrix. This matrix may be comprised of, for example, Si oxide (Nanoglass), MSQ, or an MSQ/HSQ mixture. The average pore size and size distribution of these materials will ordinarily range from about 1 to about 50 nm, with less than about 10 nm being preferred. By filling gapfill opening 22 with a relatively low dielectric constant material, the resulting semiconductor device will advantageously possess a low effective dielectric constant, e.g., less than about 2.5 and preferably from about 1.5 to about 2.2.

Optionally, additional layers (not shown) can be applied to the top surfaces of cap elements 20 and/or inorganic dielectric layer 10 or mask/polish stop layer 12 or element 24. For example, a dielectric material, which is the same type of dielectric material used in forming layer 10, i.e., an organic or inorganic dielectric material whichever is employed, can first be applied over the top surface of the device and, optionally a second mask/polish stop layer depending if an organic dielectric layer is used, with openings formed therein as discussed above, the openings being created to expose at least a portion of the top surface of cap elements 20. A conductive metal material, e.g., Cu, can then be deposited within and filling each opening to form a second set of conductive metal elements. Next, a cap material can be applied over the top surfaces of the second set of conductive metal elements and dielectric or mask/polish stop layer as a continuous layer. Then the continuous cap layer is selectively etched between the second set of elements to provide a second set of cap elements on at least a portion of the top surface of the second set of conductive metal elements.

Figure 2A:
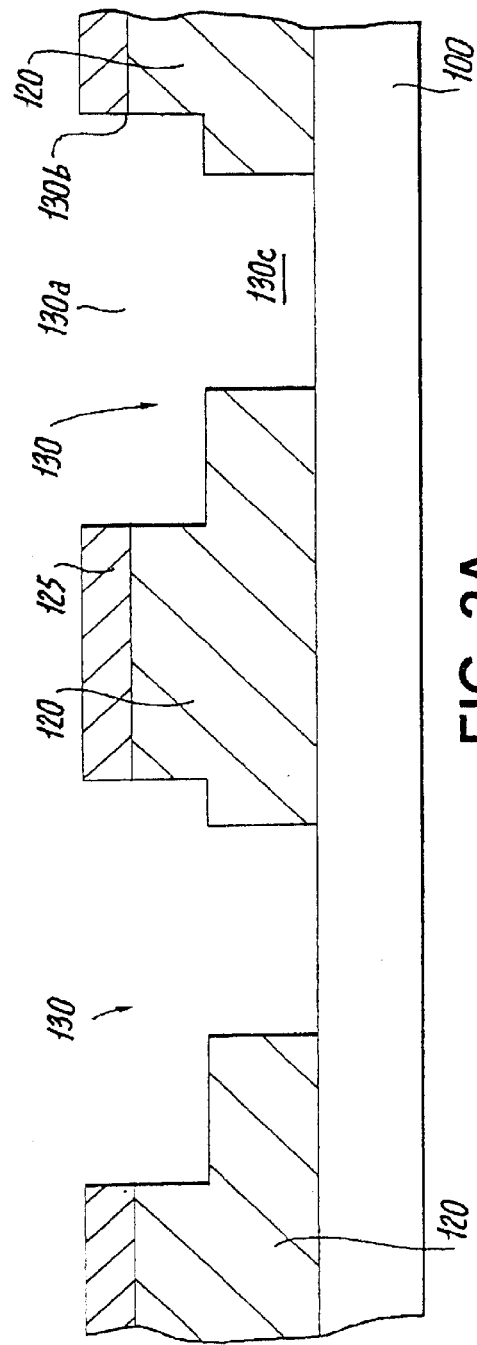
FIG. 2A is a schematic cross-sectional view of a semiconductor substrate containing a dielectric layer having opening etched therein.

As seen in the embodiments shown in FIGS. 2A–2D, an alternative semiconductor device described herein can be formed by first providing a semiconductor substrate 100 having a dielectric layer 120 formed thereon, optionally an mask/polish stop layer 125 in the case where dielectric layer is formed from an organic dielectric material, and openings 130 formed in dielectric layer 120 and optional mask/polish stop layer 125 and exposing a portion of the surface of substrate 100 as shown in FIG. 2A. Techniques and materials used in forming substrate 100, layers 120 and 125 and openings 130 are the same as those discussed with respect to the embodiment shown in FIGS. 1A and 1B. Thicknesses for each of the above layers and openings will also generally be the same as those used in forming the layers and openings of FIGS. 1A and 1B. Optionally, layer 125 may have about 2 or about 3 sub-layers.

Next, a conductive metal material 131 and segregating cap material 132 are advantageously deposited in and filling openings 130 filling. The segregating material may be deposited as a separate layer, or a mixture comprising a major amount of the conductive metal material and a minor amount of the segregating cap material may be deposited. Generally, three steps are needed to form the structure of FIG. 2B, e.g., metal deposition, CMP, and an anneal step to segregate cap material 132 to the top of opening 130. After these three steps are completed, the conductive metal material 131 fills the lower portion 130c of opening 130 and at least a portion of top portion 130a of opening 130, e.g., at a thickness ranging from about 0.05 to about 0.5 $\mu$m and preferably from about 0.1 to about 0.3 $\mu$m, with the segregated cap material 132 filling the remaining portion of top portion 130a of opening 130, e.g., at a thickness ranging from 1 nm to about 10 nm and preferably from about 2 nm to about 5 nm, as shown in FIG. 2B. In this manner, segregating cap material 132 can be formed on the surface of conductive metal material 131 as a discontinuous cap layer without having to perform subsequent lithography and etch steps as discussed above with respect to the continuous cap layer.

Suitable conductive metal materials for use herein include, but are not limited to, those discussed above with respect to filling opening 14 with Cu being also being preferred for this embodiment. Suitable segregating cap material 132 for use herein include any conventional segregating materials known to one skilled in the art. Preferred segregating materials for use herein as segregating cap material 132 include, but are not limited to, metals such as, for example, In, Mg, Al, Zr, Ce, Ir, Co, Ni, W, Sn, etc., P and the like and combinations thereof with In and $In_2$ being most preferred.

Generally, conductive metal material 131 and segregating cap material 132 can be deposited in opening 130 by first depositing one or more of the of the foregoing segregating cap materials 132 in opening 130 as a separate layer in the form of a thin film, i.e., coating, employing techniques known in the art or the segregating cap material may be deposited as a mixture of the conductive and segregating material also employing techniques known in the art. Three steps are generally needed to form the structure of FIG. 2B; metal deposition, CMP, and an anneal step to segregate material 132 to the top of 130 as a layer.

In the case where segregating cap material 132 is first deposited as a separate layer, the thin film of the segregating material will be typically applied at a thickness ranging from about 1 nm to about 100 nm and preferably from about 2 to about 5 nm. Next, conductive metal material 131 is deposited over the thin film and fills opening 130. Techniques for depositing conductive metal material 131 can be the same as those discussed above. Following opening 130 being filled with the conductive material and the step of CMP to planarize the metal, the device will be subjected to an anneal step to segregate the cap material 132 to top portion 130a of opening 130 and being on the surface of conductive metal material 131. In other words, the conductive metal material and segregating material (of the segregating oxide material) are subjected to a thermodynamic driving force by the annealing step to convert the segregating material to its oxide thereby resulting in the segregating oxide material 132 segregating to top portion 130a of opening 130 and being on the surface of conductive metal material 131. Generally, the aneal step is performed at a temperature of from about 200 to 450° C. for a time period ranging from about 10 to about 300 minutes in a gas mixture of, for example, $H_2O$ and $H_2$, which reduces the copper oxide and, in turn, oxidizes the segregating material. The ratio of partial pressure of the hydrogen to water vapor (i.e., ratio $P(H_2)/P(H_2O)$) will ordinarily range from about 0.01 to 10,000 at about 200° C. At about 400° C., the ratio $P(H_2)/P(H_2O)$ will ordinarily range from about 0.01 to about 1,000. A preferred anneal is at a temperature of about 400° C. for about 240 minutes in a furnace made by bubbling a mixture of about 5% $H_2$ and 95% $N_2$ through water.

Alternatively, in the case of depositing a mixture of the conductive and segregating materials, the segregating cap material and the conductive metal material are advantageously mixed in an amount ranging from about 1 nm to about 10 nm of a minor amount of the segregating material and from about 150 nm to about 2 microns of a major amount of conductive material. Then, the device is heat treated under similar anneal conditions as discussed above such that the segregating cap material will surface segregate and oxidize at the top portion 130a of opening 130 and form on the top surface of conductive metal material 131 as segregating oxide material 132.

Figure 2D:
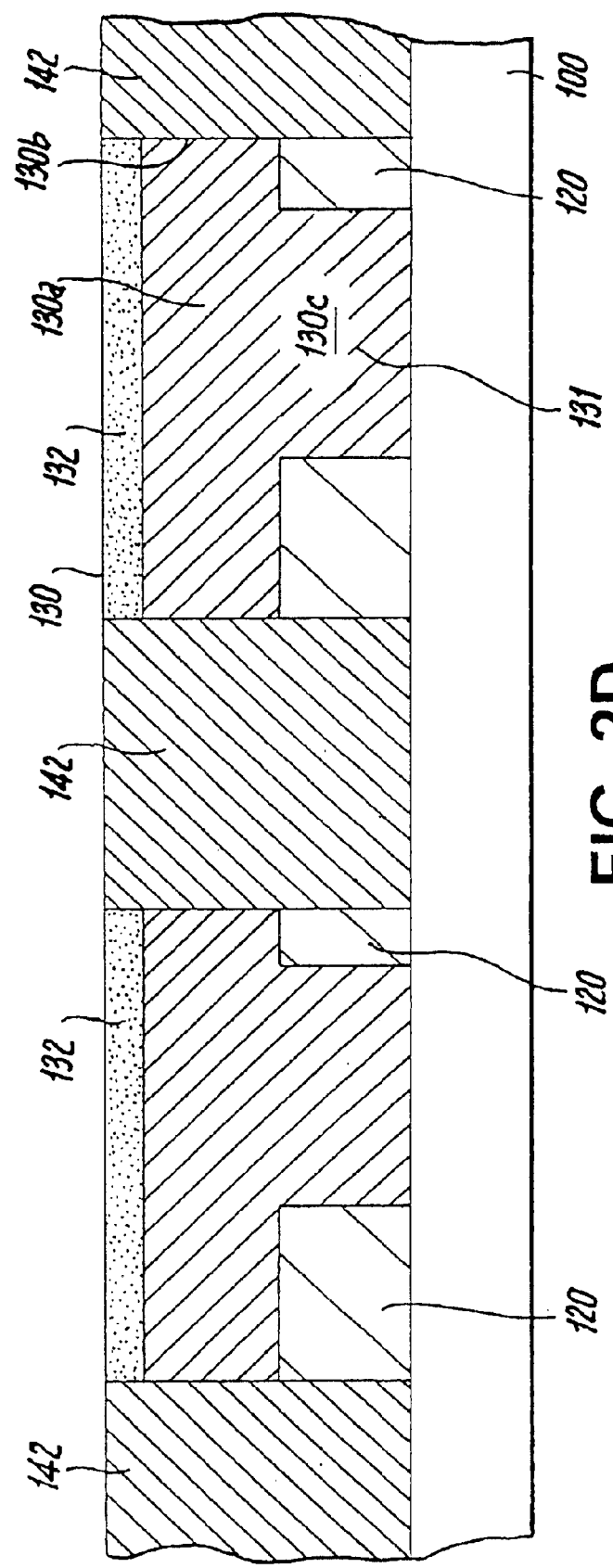
FIG. 2D is a schematic cross-sectional view of the semiconductor substrate of FIG. 2C with a dielectric material deposited in the gapfill opening.

If desired, inorganic dielectric layer 120 or mask/polish stop layer 125 and organic dielectric layer 120 can be removed between openings 130 to provide a gapfill opening 140 as shown in FIG. 2C. Generally, gapfill opening 140 can be formed by etching techniques discussed above. Following the formation of opening 140, a relatively low dielectric constant material, e.g., one possessing a dielectric constant of from about 1.5 to about 2.2 and preferably from about 1.5 to about 1.8, is deposited in and fills opening 140 to form low dielectric constant element 142 as depicted in FIG. 2D. Suitable material can generally be those discussed above with respect to element 24. By filling the gapfill opening 140 with a relatively low dielectric constant material, the resulting semiconductor device will advantageously possess a low effective dielectric constant, e.g., ranging from about 1.0 to about 3.0 and preferably from about 1.5 to about 2.3.

Optionally, additional layers (not shown) can be applied to the top surfaces of the device depicted in FIG. 2D. For example, a dielectric material, which is the same type of dielectric material used in forming layer 120, i.e., an organic or inorganic dielectric material whichever is employed, can first be applied over the top surface of the device and, optionally a second mask/polish stop layer depending if an organic dielectric layer is used, with openings formed therein as discussed above, the openings being created to expose at least a portion of the top surface of cap material 132. A conductive metal material, e.g., Cu, and segregating metal cap material can then be deposited within and filling each opening to form a second set of conductive metal material and metal oxide cap material elements.

The following non-limiting examples are illustrative of the embodiments of the present disclosure.

EXAMPLE 1

The following example is given to illustrate a device containing an organic dielectric layer with a discontinuous dielectric cap layer and gapfill opening formed and then filled within the scope of this invention.

The semiconductor substrate used in this example consists of a silicon wafer substrate of 200 mm diameter. First, the organic thermoset dielectric material SiLK from Dow Chemical Co. having a dielectric constant of 2.7 was spin coated on the top surface of the wafer at a thickness of 300 nm. As is known in the art, this material forms a substantially planarized surface by spin coating. Next, a mask/polish material comprised of Si, C and H was formed on the top surface of the organic dielectric layer as a mask/polish stop layer at a thickness of 50 nm. The layer was formed by plasma enhanced chemical vapor deposition (PE CVD) in an Applied Materials DxZ tool from trimethylsilane in a He carrier gas at 350° C., although other techniques, conditions and tools may be used. A silicon oxide or nitride layer was formed also by PE CVD on top of the mask/polish stop layer completing a bilayer hardmask. A trilayer hardmask of both SiNitride and SiOxide and the mask/polish stop layer may also be used. A top portion of a first and second opening (the line pattern) was then created in the top hardmask layer by a first lithography and dry etch step, using methods known in the art. A second opening was then created in the lower layer of the hardmask in the first and second opening by a second lithography and dry etch step, using methods known in the art. These openings are then transferred into the SiLK layer as a lower portion of the openings using dry etch methods also known in the art. The lower portion of the opening, or via opening, was formed at a width of 120 nm, while the top portion of the opening, or line opening, was formed at a width of 140 nm. Additionally, the distance between the top portions of the first and second openings was 150 nm.

To metallize the openings, first a thin conductive liner was deposited to line both the via and line openings, comprised of one or more layers of materials selected from the group TaN, Ta, Ti, TiN, W, and WN. Then, a thin Cu layer was deposited by physical vapor deposition (sputtering), and then a thick Cu layer was deposited to fill the openings by electrodeposition from solution. Finally the substrate was planarized by chemical mechanical polish (CMP) to form a set of conductive elements separated by regions of SiLK dielectric. During CMP, the top hardmask layers were removed leaving only the SiCH layer on top of the SILK between the conductive elements with the top surface of the SiCH layer being substantially co-planar with the top surface of the conductive elements.

After this CMP planarization, an electroless plating process was used to selectively deposit a thin layer of a ternary alloy of Co, W and P on the top surface of the conductive elements at a thickness of 5 nm, although from 2 to 20 nm may also be used. The process details are known to one skilled in the art. Following the formation of the conductive metal elements followed by electroless plating, gapfill openings were then formed by dry etch methods, removing first the SiCH hardmask, and then the organic dielectric material remaining between the conductive elements. The SiLK dielectric material underneath the top portions of the conductive elements and in contact with the sidewalls of the lower portion of the elements remained in place as these gapfill openings are formed. The gapfill openings were then filled with a porous dielectric material consisting of a porous methylsilsesquioxane (MSSQ), using standard spin coating and baking methods. The preferred porosity was about 50% (the percentage of the MSSQ that is pores or voids) resulting in a dielectric constant of 1.5 for the porous dielectric. This was achieved by using 50% porogen in the MSSQ preparation. Porous films of this type are available from Japan Synthetic Rubber Corporation, Honeywell Inc. under the trade name of Nanoglass, from the IBM Almaden Research Center under the tradename of "Dendriglass" and other such suppliers as is well known to those well versed in this field.

During filling of the gapfill openings, the porous dielectric formed a thick film covering the entire substrate. The thick film was then removed by a chemical mechanical polish (CMP) process that stops at the Cu surface, leaving an approximately planar surface. As would be known in the art, other porous dielectric materials may be used including porous $SiO_2$, porous HSQ (under trade name XLK from Dow Corning Inc.), porous SILK (from Dow Chemical Co.) and other such porous materials where the requirement was that they have a low dielectric constant below 2.0 and preferably substantially below 2.0.

To complete the structure, a dielectric cap material of SiNitride having a dielectric constant of about 7.0 and a thickness of 35 nm was deposited as a blanket film atop the conductive elements and the planarized porous MSSQ dielectric. The SiNitride capping dielectric was formed by plasma enhanced chemical vapor deposition (PE CVD) using a gas flow containing silane and ammonia gases at 400° C. Next, the portion of the SiNitride layer over the planarized porous MSSQ dielectric (between the conductive elements) was removed to form discontinuous cap elements of SiNitride on top of the Cu conductors. This removal was performed using a lithography and dry etch step using methods known in the art, and the same lithography MASK used in the second lithography and dry etch step may be used (because the pattern is identical).

Using a capacitance model, the effective overall dielectric constant of this device with a gapfill material having a dielectric constant of 1.5 was calculated to be 1.86. In contrast, the effective overall dielectric constant of the device with a gapfill material having a dielectric constant of 1.5 and a continuous cap layer (in the case where the portion of the SiNitride layer over the planarized porous MSSQ dielectric is not removed) was calculated to be 2.44.

As would be known to one skilled in the art, the dielectric constant of the gapfilled ILD (porous MSSQ) may be changed and the effective overall dielectric constant of the device will change accordingly. For example, when the dielectric constant of the gapfilled ILD (porous MSSQ) is 2, the effective overall dielectric constant of the device was 2.8. In contrast, the effective overall dielectric constant of the device with a gapfill material having a dielectric constant of 2.0 and a continuous cap layer (in the case where the portion of the SiNitride layer over the planarized porous MSSQ dielectric is not removed) was calculated to be 3.

Also, the cap composition may be changed within the scope of the invention, so that SiNitride in this example may by replaced by alloys of Si, C, H, or Si, N, C, and H, or by any diffusion barrier material for which a dry etch process is known.

EXAMPLE 2

The following example is given to illustrate a device containing an organic dielectric layer with a discontinuous InOxide plus Silicon Nitride cap layer and gapfill opening formed and then filled within the scope of this invention.

The semiconductor substrate used in this example consists of a silicon wafer substrate of 200 mm diameter. First, an organic thermoset dielectric material SiLK from Dow Chemical Co. having a dielectric constant of 2.7 was spin coated on the top surface of the wafer at a thickness of 300 nm. As is known in the art, this material forms a substantially planar surface by spin coating. Next, a mask/polish material comprised of Si, C and H or SiN was formed on the top surface of the organic dielectric layer as a mask/polish stop layer at a thickness of 50 nm. The layer was formed by plasma enhanced chemical vapor deposition (PE CVD) in an Applied Materials DxZ tool from an appropriate precursor gas such as trimethylsilane (for the SiCH) or silane and ammonia (for the SiN) diluted in a He carrier gas at 350° C. although other techniques, conditions and tools may be used. A silicon oxide or nitride layer was formed also by PE CVD on top of the first layer completing a bilayer hardmask. A trilayer hardmask of both SiNitride and SiOxide and the mask/polish stop layer may also be used. A top portion of a first opening and second opening (the line pattern) was created in the top hardmask layer by a first lithography and dry etch step, using methods known in the art. A second opening was then created in the lower layer of the hardmask of the first and second opening by a second lithography and dry etch step, using methods known in the art. A lower portion of each opening was then transferred into the SiLK layer using dry etch methods also known in the art. The lower portion of the openings, or via openings, was formed at a diameter of about 120 nm while the top portion of the openings, or line openings, was formed at a width of about 140 nm. Additionally, the distance between the top portions of the first and second openings was about 150 nm. Other mask/polish stop schemes can be used which may include three layer structures comprising SiCH or SiCOH, SiN and $SiO_2$, for example, to improve the ease of processing and the definition of the patterned features transferred into the SiLK layer.

To metallize the openings, first a thin conductive liner was deposited to line both the top portion and lower portions of the openings. The liner was formed from one or more layers of materials selected from the group TaN, Ta, Ti, TiN, W, and WN. The liner structure was deposited by PE CVD, sputtering, reactive sputtering or combinations thereof. Then, a thin Cu layer was deposited by physical vapor deposition (sputtering) or chemical vapor deposition (CVD) and then a thick Cu layer was deposited to fill the openings by electrodeposition from solution. Finally the substrate was planarized by chemical mechanical polish (CMP) to form a set of conductive elements separated by regions of SiLK dielectric. During CMP, the top hardmask layer was removed leaving only the SiCH or the SiN layer on top of the SILK between the conductive elements. The top surface of the residual hardmask layer was substantially co-planar with the top surface of the conductive elements.

After this CMP planarization, the substrate is heated to 350° C. in vacuum or in an oxygen-free furnace to remove adsorbed molecules and then a thin layer of In was deposited at a thickness of 5 nm by physical vapor deposition (sputtering or evaporation) on the top surface of the conductive elements. The process details are known to one skilled in the art. The substrate was then annealed at 400° C. for 240 minutes in a furnace ambient made by bubbling a mixture of 5% $H_2$ and 95% $N_2$ through water to convert the In to $In_2O_3$. The ratio of partial pressure of the hydrogen to water vapor (ratio $P(H_2)/P(H_2O)$ ) was in the range from 0.01 to 1,000 at 400° C.

Following the formation of the conductive metal elements and $In_2O_3$ formation, gapfill openings were then formed by dry etch methods. First, the residual hardmask (SiN or SiCH) was removed followed by the SiLK organic dielectric layer between the conductive elements. The SiLK dielectric material underneath the top portions of the conductive elements remained in contact with the sidewalls of the lower portion as the gapfill openings were formed. The gapfill openings were then filled with a porous dielectric material consisting of a porous methylsilsesquioxane (MSSQ) with a porosity of about 50% (the volume percentage of the voids in the matrix) resulting in a dielectric constant of about 1.5 for the porous dielectric using standard spin coating and baking methods. This was achieved by using about 50% porogen or pore generating material in the resin preparation. During filling of the gapfill openings, the porous dielectric formed a thick film covering the entire substrate and the thick film was then removed by a chemical mechanical polish (CMP) process that stops at the Cu surface, leaving an approximately planar surface.

To complete the structure, a dielectric cap material comprised of SiNitride and having a dielectric constant of about 7.0 was deposited at a thickness of 35 nm as a blanket film atop the conductive elements and the planarized porous MSSQ dielectric. The SiNitride capping dielectric was formed by plasma enhanced chemical vapor deposition (PE CVD) using a gas flow containing silane and ammonia gases at 400° C. Next, the portion of the SiNitride layer over the planarized porous MSSQ dielectric and between the conductive elements was removed to form discontinuous cap elements on top of the Cu conductors. This removal was performed using a lithography and dry etch step employing the same lithography mask used in the first lithography and dry etch step.

Using a capacitance model, the effective overall dielectric constant of this device with a gapfill material having a dielectric constant of 1.5 was calculated to be 1.86. In contrast, the effective overall dielectric constant of the device with a gapfill material having a dielectric constant of 1.5 and a continuous cap layer (in the case where the portion of the SiNitride layer over the planarized porous MSSQ dielectric is not removed) was calculated to be 2.44.

As would be known to one skilled in the art, the dielectric constant of the gapfilled ILD (porous MSSQ) may be changed and the effective overall dielectric constant of the device will change accordingly. For example, when the dielectric constant of the gapfilled ILD (porous MSSQ) is 2, the effective overall dielectric constant of the device was 2.8. In contrast, the effective overall dielectric constant of the device with a gapfill material having a dielectric constant of 2.0 and a continuous cap layer (in the case where the portion of the SiNitride layer over the planarized porous MSSQ dielectric is not removed) was calculated to be 3.

Also, the cap composition may be changed within the scope of the invention, so that SiNitride in the above example may by replaced by alloys of Si, C, H, or Si, N, C, and H, or by any diffusion barrier material for which a dry etch process is known.

EXAMPLE 3

The following example is given to illustrate a device containing an organic dielectric layer with a discontinuous SiNitride cap layer and gapfill opening formed and then filled within the scope of this invention.

The semiconductor substrate used in this example consists of a silicon wafer substrate of 200 mm diameter. First, an organic thermoset dielectric material SiLK from Dow Chemical Co. having a dielectric constant of 2.7 was spin coated on the top surface of the wafer at a thickness of 300 nm. As is known in the art, this material forms a substantially planarized surface by spin coating. Next, a mask/polish material comprised of Si, C and H was formed on the top surface of the organic dielectric layer as a mask/polish stop layer at a thickness of 50 nm. The layer was formed by plasma enhanced chemical vapor deposition (PE CVD) in an Applied Materials DxZ tool from trimethylsilane in a He carrier gas at 350° C., although other techniques, conditions and tools may be used. A silicon oxide or nitride layer was formed also by PE CVD on top of the mask/polish stop layer completing a bilayer hardmask. A trilayer hardmask of both SiNitride and SiOxide and the mask/polish stop layer may also be used. A top portion of a first and second opening (the line pattern) was then created in the top hardmask layer by a first lithography and dry etch step, using methods known in the art. A second opening was then created in the lower layer of the hardmask in the first and second opening by a second lithography and dry etch step, using methods known in the art. These openings are then transferred into the SiLK layer as a lower portion of the openings using dry etch methods also known in the art. The lower portion of the opening, or via opening, was formed at a width of 120 nm, while the top portion of the opening, or line opening, was formed at a width of 140 nm. Additionally, the distance between the top portions of the first and second openings was 150 nm.

To metallize the openings, first a thin conductive liner was deposited to line both the via and line openings, comprised of one or more layers of materials selected from the group TaN, Ta, Ti, TiN, W, and WN. Then, a thin Cu layer was deposited by physical vapor deposition (sputtering), and then a thick Cu layer was deposited to fill the openings by electrodeposition from solution. Finally the substrate was planarized by chemical mechanical polish to form a set of conductive elements separated by regions of SiLK dielectric. During CMP, the top hardmask layers were removed leaving only the SiCH layer on top of the SILK between the conductive elements with the top surface of the SiCH layer being substantially co-planar with the top surface of the conductive elements.

Following the formation of the conductive metal elements, gapfill openings were then formed by dry etch methods, removing first the SiCH hardmask, and then the organic dielectric material between the conductive elements. The SiLK dielectric material underneath the top portions of the conductive elements and in contact with the sidewalls of the lower portion of the elements remained in place as these gapfill openings are formed. The gapfill openings were then filled with a porous dielectric material consisting of a porous methylsilsesquioxane (MSSQ), using standard spin coating and baking methods. The preferred porosity was about 50% (the percentage of the MSSQ that is pores or voids) resulting in a dielectric constant of 1.5 for the porous dielectric. This was achieved by using 50% porogen in the MSSQ preparation. Porous films of this type are available from Japan Synthetic Rubber Corporation, Honeywell Inc. under the trade name of Nanoglass, from the IBM Almaden Research Center under the tradename of "Dendriglass" and other such suppliers as is well known to those well versed in this field.

During filling of the gapfill openings, the porous dielectric formed a thick film covering the entire substrate. The thick film was then removed by a chemical mechanical polish (CMP) process that stops at the Cu surface, leaving an approximately planar surface. As would be known in the art, other porous dielectric materials may be used including porous $SiO_2$, porous HSQ (under trade name XLK from Dow Corning Inc.), porous SILK (from Dow Chemical Co.) and other such porous materials where the requirement was that they have a low dielectric constant below 2.0 and preferably substantially below 2.0.

To complete the structure, a dielectric cap material of SiNitride having a dielectric constant of about 7.0 and a thickness of 35 nm was deposited as a blanket film atop the conductive elements and the planarized porous MSSQ dielectric. The SiNitride capping dielectric was formed by plasma enhanced chemical vapor deposition (PE CVD) using a gas flow containing silane and ammonia gases at 400° C. Next, the portion of the SiNitride layer over the planarized porous MSSQ dielectric (between the conductive elements) was removed to form discontinuous cap elements of SiNitride on top of the Cu conductors. This removal was performed using a lithography and dry etch step using methods known in the art, and the same lithography MASK used in the second lithography and dry etch step may be used (because the pattern is identical).

Using a capacitance model, the effective overall dielectric constant of this device with a gapfill material having a dielectric constant of 1.5 was calculated to be 1.86. In contrast, the effective overall dielectric constant of the device with a gapfill material having a dielectric constant of 1.5 and a continuous cap layer (in the case where the portion of the SiNitride layer over the planarized porous MSSQ dielectric is not removed) was calculated to be 2.44.

As would be known to one skilled in the art, the dielectric constant of the gapfilled ILD (porous MSSQ) may be changed and the effective overall dielectric constant of the device will change accordingly. For example, when the dielectric constant of the gapfilled ILD (porous MSSQ) is 2, the effective overall dielectric constant of the device was 2.8. In contrast, the effective overall dielectric constant of the device with a gapfill material having a dielectric constant of 2.0 and a continuous cap layer (in the case where the portion of the SiNitride layer over the planarized porous MSSQ dielectric is not removed) was calculated to be 3.

Also, the cap composition may be changed within the scope of the invention, so that SiNitride in this example may by replaced by alloys of Si, C, H, or Si, N, C, and H or by other suitable materials.

EXAMPLE 4

The following example is given to illustrate a device containing an organic dielectric layer with a discontinuous SiNitride cap layer and with a buried RIE stop within the scope of this invention.

The semiconductor substrate used in this example consists of a silicon wafer substrate of 200 mm diameter. First, a dielectric stack of 3 sub-layers was deposited on the top surface of the wafer. There were 2 layers of a organic thermoset dielectric material (such as SiLK from Dow Chemical Co.) and having a dielectric constant of 2.7. The thickness of each layer was about 150 nm. Between the layers was a layer of a Si containing spin-on dielectric (such as HOSP from Honeywell Corp.) that was 30 nm thick. As is known in the art, these materials form a substantially planarized surface by spin coating, and also different thicknesses for the 3 sub-layers may be used within the scope of the invention. Next, a mask/polish stop layer comprised of Si, C and H was formed on the top surface of the organic dielectric layer at a thickness of 50 nm. The layer was formed by plasma enhanced chemical vapor deposition (PE CVD) in an Applied Materials DxZ tool from trimethylsilane in a He carrier gas at 350° C.

A silicon nitride (SiN) layer was formed also by PE CVD on top of the SiCH layer, and then a 3rd layer, commonly SiOxide, was deposited by PE CVD, completing a trilayer hardmask. A top portion of a first and second opening (the line pattern) was then created in the top SiOxide hardmask layer by a first lithography and dry etch step, using methods known in the art. A second opening was then created in the SiN and SiCH layers of the hardmask of the first and second opening by a second lithography and dry etch step, using methods known in the art. These openings were then transferred into the SiLK layer to form a lower portion of the first and second opening using dry etch methods also known in the art. The lower portion of the opening, or via opening, was formed at a width of 120 nm while the top portion of the opening, or line opening, was formed at a width of 140 nm. Additionally, the distance between the top portions of the first and second openings was 150 nm.

To metallize the openings, first a thin conductive liner was deposited to line both the via and line openings, comprised of one or more layers of materials selected from the group TaN, Ta, Ti, TiN, W, and WN. Then, a thin Cu layer was deposited by physical vapor deposition (sputtering), and a thick Cu layer was deposited to fill the openings by electrodeposition from solution. Finally the substrate was planarized by chemical mechanical polish (CMP) to form a set of conductive elements separated by regions of SiLK dielectric. During CMP, the top hardmask layers were removed, leaving only the SiCH layer on top of the SILK between the conductive elements, and the top surface of the SiCH layer was substantially co-planar with the top surface of the conductive elements.

To complete the structure, a dielectric cap comprised of SiNitride and having a dielectric constant of about 7 and a thickness of 35 nm was deposited as a blanket film atop the conductive elements and the planarized porous MSSQ dielectric. The SiNitrde capping dielectric was formed by plasma enhanced chemical vapor deposition (PE CVD) using a gas flow containing silane and ammonia gases at 400° C. Next, the portion of the SiNitride layer over the SiCH Hardmask layer was removed to form discontinuous cap elements comprised of SiNitride on top of the Cu conductors. This removal was performed using a lithography and dry etch step using methods known in the art, and the same lithography MASK used in the first lithography and dry etch step may be used (because the pattern is identical).

Using a capacitance model, the effective overall dielectric constant of this device with a gapfill material having a dielectric constant of 1.5 was calculated to be 2.95. In contrast, the effective overall dielectric constant of the device with a gapfill material having a dielectric constant of 1.5 and a continuous cap layer (in the case where the portion of the SiNitride layer is not removed) was calculated to be 3.4.

A porous dielectric may also be used within this invention. Examples are porous methylsilsesquioxane (MSSQ), porous SiLK, porous films available from Japan Synthetic Rubber Corporation, Honeywell Inc. under the trade name of Nanoglass, and as the material called "Dendriglass" from the IBM Almaden Research Center and other such suppliers as is well known to those well versed in this field. When a porous dielectric was used, the effective overall dielectric constant of the device was reduced. Also within this invention, the buried RIE stop can be left out of the structure. Also, the Cap composition may be changed within the scope of the invention, so that SiNitride in this example may by replaced by alloys of Si, C, H, or Si, N, C, and H, or by other suitable materials.

Although the invention has been described in its preferred form with a certain degree of particularity, obviously many changes and variations are possible therein and will be apparent to those skilled in the art after reading the foregoing description. It is therefore to be understood that the present invention may be presented otherwise than as specifically described herein without departing from the spirit and scope thereof.

What is claimed is:

1. A semiconductor device possessing a relatively low effective dielectric constant comprising:
   a substrate;
   at least one dielectric layer formed on the substrate;
   a plurality of openings formed in the dielectric layer and exposing the surface of the substrate;
   a conductive metal material deposited in and filling at least a portion of the openings to form metal plugs, the conductive metal material at least partially formed on top of a part of the dielectric layer; and
   a selectively located layer of cap material covering at least the top of the metal plugs without covering said dielectric layer formed directly on the substrate.

2. The semiconductor device of claim 1 wherein the conductive metal material is selected from the group consisting of Ti, TiN, TiW, Ta, TaN, W, Al, Pd, Cu and combinations thereof.

3. The semiconductor device of claim 1 wherein the cap material is one or more materials selected from the group consisting of In, Mg, Al, Zr, Ce, Ir, Co, W, Ni, Sn, P and their oxides.

4. The semiconductor device of claim 1 wherein the conductive metal material is deposited in and fills the openings to form the metal plugs and the cap material is a dielectric material selected from the group consisting of silicon nitride, SiCH and SiNCH.

5. The semiconductor device of claim 1 possessing an effective dielectric constant from about 1.5 to about 3.5.

6. The semiconductor device of claim 1 wherein the dielectric layer is formed from a material selected from the group consisting of organic and inorganic dielectric material.

7. The semiconductor device of claim 6 wherem the organic dielectric material is a porous or non-porous material selected from the group consisting of SiLK, Flare and other organic polymer thermosets.

8. The semiconductor of claim 7 further comprising mask/CMP stop layer formed on the organic dielectric layer.

9. The semiconductor device of claim 8 wherein the mask/CMP stop layer is formed from a material selected from the group consisting of silicon nitride, SiCH, SiCOH, silicon oxide and combinations thereof.

10. The semiconductor device of claim 6 wherein the inorganic dielectric material is selected from the group consisting of carbon doped oxide, alloys of Si, C, O and H, F doped oxide, spin-on methylsilsesquioxane, hydrogen silsesquioxane, phenylsilsesquioxane, mixtures of spin-on methylsilsesquioxane, hydrogen silsesquioxane and phenylsilsesquioxane and porous $SiO_2$.

11. The semiconductor device of claim 6 wherein the conductive metal material is Cu.

12. The semiconductor device of claim 11 wherein the cap material is one or more materials selected from the group consisting of In, Mg, Al, Zr, Ce, Ir, Co, W, Ni, Sn, P and their oxides.

13. The semiconductor device of claim 11 wherein the conductive material is deposited in and fills the openings to form the plug and the cap material is a dielectric material selected from the group consisting of silicon nitride, SiCH and SiNCH.

14. The semiconductor device of claim 13 possessing an effective dielectric constant from about 1.5 to about 3.5.

15. A semiconductor device comprising:
    a substrate having a first dielectric material formed directly on the substrate;
    at least a first and second opening formed in the dielectric material and exposing the surface of the substrate, the openings having a top portion with defining sidewalls and a lower portion having defining sidewalls, the top portion of the opening having a width greater than the lower portion;
    a conductive metal material deposited in and filling at least a portion of the first and second opening to form a first and second metal plug;
    a selectively located layer of cap material covering at least the top of the first and second metal plugs without completely covering at least said first and second metal plugs;
    at least a third opening formed between the first and second openings and exposing the surface of the substrate, the width of the third opening being defined by the distance between the top portions of the first and second opening; and
    a second dielectric material deposited in and filling the third opening.

16. The semiconductor device of claim 15 wherein the conductive metal material is selected from the group consisting of Ti, TiN, TiW, Ta, TaN, W, Al, Pd, Cu and combinations thereof.

17. The semiconductor device of claim 15 wherein the cap material is one or more materials selected from the group consisting of In, Mg, Al, Zr, Ce, Ir, Co, W, Ni, Sn, P and their oxides.

18. The semiconductor device of claim 15 wherein the second dielectric material is a porous Si containing dielectric selected from the group consisting of Si oxide, methylsilsesquioxane, hydrogen silsesquioxane, phenyl silsesquioxane, mixtures of spin-on methylsilsesquioxane, hydrogen silsesquioxane and phenylsilsesquioxane and spin on glasses.

19. A semiconductor device of claim 15 wherein the second dielectric material possesses a lower dielectric constant than the first dielectric material.

20. The device of claim 15 wherein the second dielectric material is essentially co-planar with the top surface of the selectively located layer of cap material.

21. The semiconductor device of claim 15 possessing an effective dielectric constant from about 1.0 to about 3.0.

22. The semiconductor device of claim 15 wherein the conductive metal material is deposited in and fills the first and second opening to form the first and second plug.

23. The semiconductor device of claim 22 wherein the selectively located layer of cap material covering at least the top of the first and second metal plugs is a dielectric material selected from the group consisting of silicon nitride, SiCH and SiNCH.

24. The semiconductor device of claim 23 possessing an effective dielectric constant from about 1.0 to about 3.0.

25. The semiconductor device of claim 15 wherein the first dielectric material is selected from the group consisting of organic and inorganic dielectric material.

26. The semiconductor device of claim 25 wherein the organic dielectric material is a porous or non-porous material selected from the group consisting of SiLK, Flare, and other organic polymer thermoset dielectrics.

27. The semiconductor device of claim 25 wherein the inorganic dielectric material is selected from the group consisting of carbon doped oxide, alloys of Si, C, O and H, F doped oxide, spin-on methylsilsesquioxane, hydrogen silsesquioxane, phenylsilsesquioxane, mixtures of spin-on methylsilsesquioxane, hydrogen silsesquioxane and phenylsilsesquioxane and porous $SiO_2$.

28. The semiconductor device of claim 25 wherein the conductive metal material is Cu.

* * * * *